(12) United States Patent
Myung et al.

(10) Patent No.: US 12,008,297 B1
(45) Date of Patent: Jun. 11, 2024

(54) METHOD FOR PERFORMING DOUBLE CLUSTERING TO EVALUATE PLACEMENT OF SEMICONDUCTOR DEVICES

(71) Applicant: MakinaRocks Co., Ltd., Seoul (KR)

(72) Inventors: Wooshik Myung, Seoul (KR); Jiyoon Lim, Seoul (KR); Seungju Kim, Seoul (KR); Wonjun Yoo, Seoul (KR)

(73) Assignee: MakinaRocks Co., Ltd., Seoul (KR)

( * ) Notice: Subject to any disclaimer, the term of this patent is extended or adjusted under 35 U.S.C. 154(b) by 0 days.

(21) Appl. No.: 18/420,110

(22) Filed: Jan. 23, 2024

(30) Foreign Application Priority Data

Jan. 25, 2023 (KR) ........................ 10-2023-0009532

(51) Int. Cl.
*G06F 30/327* (2020.01)
*G06F 30/31* (2020.01)
*G06F 30/392* (2020.01)
*G06F 30/398* (2020.01)

(52) U.S. Cl.
CPC ............ *G06F 30/327* (2020.01); *G06F 30/31* (2020.01); *G06F 30/392* (2020.01); *G06F 30/398* (2020.01)

(58) Field of Classification Search
CPC .................................................... G06F 30/327
USPC ........................................................ 716/119
See application file for complete search history.

(56) References Cited

U.S. PATENT DOCUMENTS

| | | |
|---|---|---|
| 5,926,396 A | 7/1999 | Ohara |
| 5,926,398 A | 7/1999 | Nakamura |
| 10,970,452 B2 | 4/2021 | Lim et al. |
| 11,854,916 B2 | 12/2023 | Myung |
| 2004/0083441 A1 | 4/2004 | Gweon et al. |
| 2007/0157146 A1 | 7/2007 | Chen et al. |
| 2015/0007120 A1* | 1/2015 | Erickson ................. G06F 30/34 716/105 |

FOREIGN PATENT DOCUMENTS

| | | |
|---|---|---|
| JP | 2004-086755 A | 3/2004 |
| JP | 2007-188488 A | 7/2007 |
| JP | 2011-257885 A | 12/2011 |
| KR | 100272887 B1 | 11/2000 |
| KR | 100296183 B1 | 10/2001 |
| KR | 100486274 B1 | 4/2005 |

(Continued)

OTHER PUBLICATIONS

Notice of Grounds for Rejection issued in corresponding Korean Application No. 10-2023-0009532 dated Apr. 24, 2023 (17 pages).

(Continued)

*Primary Examiner* — Eric D Lee
(74) *Attorney, Agent, or Firm* — Osha Bergman Watanabe & Burton LLP

(57) ABSTRACT

Disclosed is a method of performing double clustering to evaluate placement of semiconductor devices performed by a computing device according to an exemplary embodiment of the present disclosure. The method includes receiving connection relationship information representing a connection relationship between semiconductor devices, perform clustering on the semiconductor devices by utilizing first reference information based on the connection relationship information, and perform sub-clustering in a cluster generated by the clustering, by utilizing second reference information based on the connection relationship information.

19 Claims, 8 Drawing Sheets

(56) References Cited

FOREIGN PATENT DOCUMENTS

| KR | 101044295 B1 | 6/2011 |
| KR | 20210008248 A | 1/2021 |
| KR | 102430483 B1 | 8/2022 |
| WO | 2018/089378 A1 | 5/2018 |

OTHER PUBLICATIONS

Notice of Allowance issued in corresponding Korean Application No. 10-2023-0009532 dated Oct. 27, 2023 (6 pages).

* cited by examiner

METHOD FOR PERFORMING DOUBLE CLUSTERING TO EVALUATE PLACEMENT OF SEMICONDUCTOR DEVICES

CROSS-REFERENCE TO RELATED APPLICATIONS

This application claims priority to and the benefit of Korean Patent Application No. 10-2023-0009532 filed in the Korean Intellectual Property Office on Jan. 25, 2023, the entire contents of which are incorporated herein by reference.

TECHNICAL FIELD

The present disclosure relates to a semiconductor device placement evaluating method, and more particularly, to a method for evaluating placement of a semiconductor device using double clustering.

This study was carried out as a part of the private intelligent information service expansion project of the Ministry of Science and ICT and the Information and Communication Industry Promotion Agency (A0903-21-1021, development of AI based semiconductor design automation system).

BACKGROUND ART

Despite technological advances, the reality is that a logical design of semiconductors which can be seen as an integral part of the high-tech industry is generally performed by engineers using a rule based software. Accordingly, the logical design of the semiconductor should be performed based on the experience of the engineers and the design speed may greatly vary depending on the skill level of the engineers. Further, actually, it is very difficult for the engineer to efficiently place tens to millions of semiconductor devices while keeping the connection relationship of the semiconductor devices in mind. That is, since the current semiconductor designing process depends on the engineer's experience and intuition, it is difficult to maintain a consistent design quality and a considerable amount of time and money to be invested for the design is inevitably required.

Evaluation performed for tens to millions of placed semiconductor devices has also high complexity. It takes a lot of time to evaluate the placement of tens to millions of semiconductor devices so that a study for a semiconductor device placement evaluating method to reduce the complexity of the operation is necessary.

Korean Patent No. 10-0296183 (Oct. 22, 2001) discloses a design method of a semiconductor integrated circuit.

SUMMARY OF THE INVENTION

An object of the present disclosure is to provide a method of evaluating placement of semiconductor devices to reduce the problem complexity by reducing a number of objects to be evaluated by the double clustering.

In the meantime, the technical object to be achieved by the present disclosure is not limited to the technical object mentioned above, and various technical objects may be included within the range apparent to those skilled in the art from the content to be described below.

In order to achieve the above-described objects, a method of performing double clustering to place a semiconductor device performed by a computing device according to an exemplary embodiment of the present disclosure is disclosed. The method includes receiving connection relationship information representing a connection relationship between semiconductor devices, perform clustering on the semiconductor devices by utilizing first reference information based on the connection relationship information, and performing sub-clustering in a cluster generated by the clustering, by utilizing second reference information based on the connection relationship information.

In one exemplary embodiment, the connection relationship information includes a netlist and the first reference information based on the connection relationship information expresses the netlist with a hypergraph and then includes group information generated by the partitioning on the hypergraph.

In one exemplary embodiment, the second reference information based on the connection relationship information includes hierarchy information included in the netlist.

In one exemplary embodiment, performing sub-clustering in a cluster generated by the clustering includes acquiring hierarchy information on the netlist from each of semiconductor devices included in the cluster, identifying semiconductor devices classified into the same group in the hierarchy information on the netlist, among semiconductor devices included in the cluster; and generating a sub-cluster including the identified semiconductor devices.

In one exemplary embodiment, the method further includes evaluating the placement of the semiconductor devices based on a sub-cluster generated based on the double clustering including the clustering and the sub-clustering.

In one exemplary embodiment, the type of semiconductor device includes a macro device type and a standard device type and the macro device type and the standard device type are classified based on a device size.

In one exemplary embodiment, the double clustering including the clustering and the sub-clustering is performed on semiconductor devices corresponding to the standard device type.

In one exemplary embodiment, evaluating the placement of the semiconductor device includes acquiring a sub-cluster to be placed; and calculating a reward related to the placement of a sub-cluster to be placed, based on the relationship between the sub-cluster to be placed, the sub-clusters which have been already placed, and the macro devices which have been already placed.

In one exemplary embodiment, the reward related to the placement of the sub-cluster to be placed may include at least one reward of a reward based on an optimization algorithm or a reward based on the reinforcement learning.

In one exemplary embodiment, the reward related to the placement of the sub-cluster to be placed is calculated by assuming each of sub-cluster to be placed and the sub-clusters which have been already placed as a single device.

In one exemplary embodiment, the method further includes simulating placement of a semiconductor device by utilizing electronic design automation (EDA) software; and partitioning the sub-cluster generated by the sub-clustering based on a result of the simulation utilizing the EDA software.

In one exemplary embodiment, partitioning the sub-cluster generated by the sub-clustering based on a result of the simulation utilizing the EDA software includes: acquiring distance information between semiconductor devices included in the sub-cluster, based on the simulation result; and generating two or more new sub-clusters by partitioning semiconductor devices included in the sub-cluster based on the acquired distance information.

In order to achieve the above-described objects, according to an aspect of the present disclosure, a computer program stored in a non-transitory computer readable storage medium is disclosed. When the computer program is executed in one or more processors, the computer program allows one or more processors to perform the following operations for performing double clustering to place the semiconductor device and the operations include: an operation of receiving connection relationship information representing a connection relationship between semiconductor devices; an operation of performing clustering on the semiconductor devices by utilizing first reference information based on the connection relationship information, and an operation of performing sub-clustering in a cluster generated by the clustering, by utilizing second reference information based on the connection relationship information.

In one exemplary embodiment, the operations further include an operation of evaluating the placement of the semiconductor devices based on a sub-cluster generated based on the double clustering including the clustering and the sub-clustering.

In one exemplary embodiment, the type of semiconductor device includes a macro device type and a standard device type and the macro device type and the standard device type are classified based on a device size.

In one exemplary embodiment, the double clustering including the clustering and the sub-clustering is performed on semiconductor devices corresponding to the standard device type.

In one exemplary embodiment, the operation of evaluating the placement of the semiconductor device includes an operation of acquiring a sub-cluster to be placed; and an operation of calculating a reward related to the placement of a sub-cluster to be placed, based on the relationship between the sub-cluster to be placed, the sub-clusters which have been already placed, and the macro devices which have been already placed.

In one exemplary embodiment, the reward related to the placement of the sub-cluster to be placed may include at least one reward of a reward based on an optimization algorithm or a reward based on the reinforcement learning.

In one exemplary embodiment, the reward related to the placement of the sub-cluster to be placed is calculated by assuming each of the sub-cluster to be placed and the sub-clusters which have been already placed as a single device.

In order to achieve the object as described above, according to an aspect of the present disclosure, a computing device is disclosed. The device includes: at least one processor; and a memory and the at least one processor is configured to receive connection relationship information representing a connection relationship between semiconductor devices; perform clustering on the semiconductor devices by utilizing first reference information based on the connection relationship information, and perform sub-clustering in a cluster generated by the clustering, by utilizing second reference information based on the connection relationship information.

In one exemplary embodiment, the connection relationship information includes a netlist and the first reference information based on the connection relationship information expresses the netlist with a hypergraph and then includes group information generated by the partitioning on the hypergraph.

In one exemplary embodiment, the second reference information based on the connection relationship information includes hierarchy information included in the netlist.

In one exemplary embodiment, the at least one processor is configured to acquire hierarchy information on the netlist from each of semiconductor devices included in the cluster, identify semiconductor devices classified into the same group in the hierarchy on the netlist, among semiconductor devices included in the cluster, and generate a sub-cluster including the identified semiconductor devices.

In one exemplary embodiment, the at least one processor is configured to simulate placement of a semiconductor device by utilizing electronic design automation (EDA) software and partition the sub-cluster generated by the sub-clustering based on a result of the simulation utilizing the EDA software.

In one exemplary embodiment, the at least one processor is configured to acquire distance information between semiconductor devices included in the sub-cluster, based on the simulation result; and generate two or more new sub-clusters by partitioning semiconductor devices included in the sub-cluster based on the acquired distance information.

According to the present disclosure, a method for evaluating placement of semiconductor devices using double clustering to reduce the complexity of the operation is provided to evaluate the placement of the semiconductor devices.

The effects of the present disclosure are not limited to the aforementioned effects, and various other effects are included within a range which is obvious to those skilled in the art from the following description.

DETAILED DESCRIPTION OF THE EMBODIMENT

Figure 1:
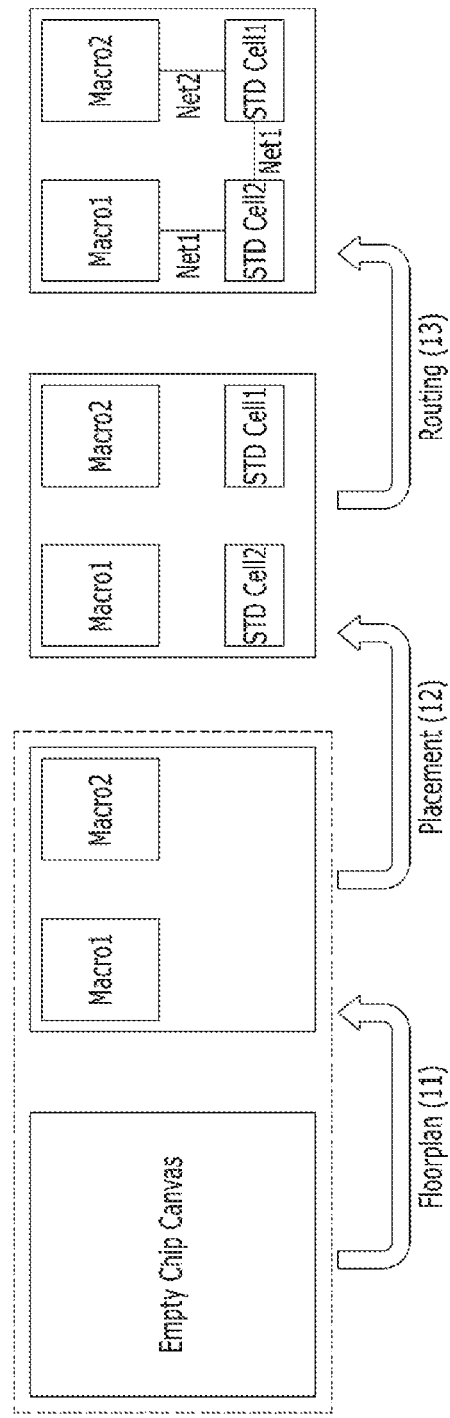
FIG. 1 is a conceptual view illustrating a basic semiconductor design process.

Various exemplary embodiments will now be described with reference to drawings. In the present specification, various descriptions are presented to provide appreciation of the present disclosure. However, it is apparent that the exemplary embodiments can be executed without the specific description.

"Component", "module", "system", and the like which are terms used in the specification refer to a computer-related entity, hardware, firmware, software, and a combination of the software and the hardware, or execution of the software. For example, the component may be a processing procedure executed on a processor, the processor, an object, an execution thread, a program, and/or a computer, but is not limited thereto. For example, both an application executed in a computing device and the computing device may be the components. One or more components may reside within the processor and/or a thread of execution. One component may be localized in one computer. One component may be distributed between two or more computers. Further, the components may be executed by various computer-readable media having various data structures, which are stored therein. The components may perform communication through local and/or remote processing according to a signal (for example, data transmitted from another system through a network such as the Internet through data and/or a signal from one component that interacts with other components in a local system and a distribution system) having one or more data packets, for example.

The term "or" is intended to mean not exclusive "or" but inclusive "or". That is, when not separately specified or not clear in terms of a context, a sentence "X uses A or B" is intended to mean one of the natural inclusive substitutions. That is, the sentence "X uses A or B" may be applied to any of the case where X uses A, the case where X uses B, or the case where X uses both A and B. Further, it should be understood that the term "and/or" used in this specification designates and includes all available combinations of one or more items among enumerated related items.

It should be appreciated that the term "comprise" and/or "comprising" means presence of corresponding features and/or components. However, it should be appreciated that the term "comprises" and/or "comprising" means that presence or addition of one or more other features, components, and/or a group thereof is not excluded. Further, when not separately specified or it is not clear in terms of the context that a singular form is indicated, it should be construed that the singular form generally means "one or more" in this specification and the claims.

The term "at least one of A or B" should be interpreted to mean "a case including only A", "a case including only B", and "a case in which A and B are combined".

Those skilled in the art need to recognize that various illustrative logical blocks, configurations, modules, circuits, means, logic, and algorithm steps described in connection with the exemplary embodiments disclosed herein may be additionally implemented as electronic hardware, computer software, or combinations of both sides. To clearly illustrate the interchangeability of hardware and software, various illustrative components, blocks, configurations, means, logic, modules, circuits, and steps have been described above generally in terms of their functionalities. Whether the functionalities are implemented as the hardware or software depends on a specific application and design restrictions given to an entire system. Skilled artisans may implement the described functionalities in various ways for each particular application. However, such implementation decisions should not be interpreted as causing a departure from the scope of the present disclosure.

The description of the presented exemplary embodiments is provided so that those skilled in the art of the present disclosure use or implement the present disclosure. Various modifications to the exemplary embodiments will be apparent to those skilled in the art. Generic principles defined herein may be applied to other embodiments without departing from the scope of the present disclosure. Therefore, the present disclosure is not limited to the exemplary embodiments presented herein. The present disclosure should be analyzed within the widest range which is coherent with the principles and new features presented herein.

In the present disclosure, a network function and an artificial neural network and a neural network may be interchangeably used.

FIG. 1 is a conceptual view illustrating a basic semiconductor design process.

According to an exemplary embodiment of the present disclosure, in order to design a semiconductor, netlist information which defines characteristics of the semiconductor devices and a connection relationship between devices is necessary. In the netlist information, the semiconductor devices are divided into macro cells having a relatively larger size and standard cells having relatively smaller sizes. The macro cell does not have a separate specification for the size and is configured by millions of transistors to usually have a larger size than a standard cell. For example, the macro cell includes an SRAM or a CPU core. The standard cell refers to a small unit of device which is configured by one or more transistors and performs a basic function. The standard cell provides simple logical operations (for example, AND, OR, XOR) or a storage function such as flip-flops and sometimes provides more complex functions such as 2-bit full adders or multiple D-input flip-flops. Unlike the macro cell, the standard cell has a specification defined for the size.

The netlist information is considered as a set for nets representing the connectivity of semiconductor devices. The netlist information generally represents an attribute and a connection relationship of hundreds of macro cells and hundreds of thousands to millions of standard cells with hypergraph structured data. The hypergraph is a graph in which one edge expresses a connection relationship with a plurality of nodes, unlike an ordinary graph in which one edge represents a connection relationship with two nodes. The net represents that each semiconductor device receives an electrical signal from which semiconductor device and transmits an electrical signal to which device.

Referring to FIG. 1, the process for designing a semiconductor is divided into three steps. First, a floorplan step 11 in which a macro cell having a relatively larger size is placed in an empty canvas is performed. Next, a placement step 12 is performed to dispose a standard cell in a space of the canvas remaining after placing the macro cell. Finally, a routing step 13 is performed to physically connect the macro cell and the standard cell disposed in the canvas through a wire.

A metric called PPA evaluates whether a good design is performed by means of the processes as described above. PPA stands for power, performance, and area. According to the PPA, the semiconductor design aims to have a low production cost at a high integration degree in a small area with low power consumption and a high performance. In order to optimize the PPA according to this aim, a length of the wire which connects the semiconductor devices needs to be shortened. When the length of the wire which connects the devices is shortened, the arrival of the electrical signal may be accelerated. When the arrival of the electrical signal is accelerated, the performance of the semiconductor is inevitably improved. Further, the electrical signal is transmitted in a short time so that the power consumption is reduced. Further, when the overall use of the wire is reduced, the degree of integration is increased and an area occupied by the devices should be reduced.

According to the above-described point of view, it is considered to simply place all devices to be close to each other to achieve a good design. However, a routing resource which represents a resource allocating a wire is limited for every canvas so that it is practically impossible to simply place all devices to be close to each other. For example, if there is another wire already in a path through which a wire for connecting two devices passes, the wire for connecting two devices has no choice but to bypass another wire to be disposed through another canvas area. In this case, the wire is bypassed so that the length of the wire is inevitably increased, which inevitably affects the placement of the wire for connecting subsequent devices. That is, a routing resource which is a resource which physically allocates the wire is limited in every area of the canvas so that if the devices are disposed without considering the routing resource, a bad design result is inevitable.

Accordingly, for the purpose of a good design, it is important to consider an overall connectivity including a standard cell from the floorplan step 11 in which macro cells having relatively larger sizes and many connectivities are disposed. Currently, the floorplan step 11 is mainly manually performed by the engineers. For example, in the floorplan step 11, the macro cell is disposed by the intuition of the engineer. In many cases, the engineer mainly disposes the macro cell at the edge of the canvas to leave a center space for placement of the standard cell. After disposing the macro cell, the engineer disposes the standard cell using a function provided by an existing commercial EDA tool. That is, the current logical design process of the semiconductor is performed greatly depending on the experience of the engineer. According to this method, it is practically very difficult to dispose the devices while keeping the connection relationship of hundreds of thousands to millions of devices in mind so that there is a problem in that a task performing speed or a quality of the result may vary depending on the skill level of the engineer. Further, in some cases, the design processes 12 and 13 which follow the floorplan step 11 takes several days or more and when the quality of the final design result is not good, the subsequent processes 12 and 13 from the floorplan step 11 need to be performed again. Repeating this cycle several times may be very costly. Accordingly, a method which performs quick and accurate design and reduces the variation of the design quality from the logical design step of the semiconductor is necessary.

In the meantime, the result of the existing floorplan step 11 is measured using an exclusive electronic design automation (EDA) tool such as ICC2. In the process of evaluating a placement result after the floorplan step 11, the placement is evaluated by keeping the connection relationship of several hundreds of thousands to millions of devices in mind and all computations for every new placement need to be performed so that it takes a lot of time. Accordingly, a method for simplifying the process of evaluating the placement of the semiconductor device and reducing the problem complexity is necessary.

Figure 2:
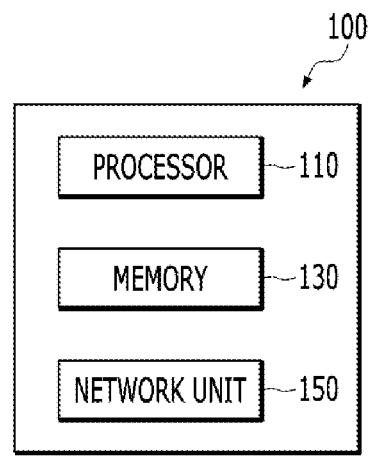
FIG. 2 is a block diagram of a computing device for performing double clustering to place a semiconductor device according to an exemplary embodiment of the present disclosure.

FIG. 2 is a block diagram of a computing device for performing double clustering to place a semiconductor device according to an exemplary embodiment of the present disclosure.

A configuration of the computing device 100 illustrated in FIG. 2 is only an example shown through simplification. In an exemplary embodiment of the present disclosure, the computing device 100 may include other components for performing a computing environment of the computing device 100 and only some of the disclosed components may constitute the computing device 100.

The computing device 100 may include a processor 110, a memory 130, and a network unit 150.

The processor 110 may be constituted by one or more cores and may include processors for data analysis and deep learning, which include a central processing unit (CPU), a general purpose graphics processing unit (GPGPU), a tensor processing unit (TPU), and the like of the computing device. The processor 110 may read a computer program stored in the memory 130 to perform data processing for machine learning according to an exemplary embodiment of the present disclosure. According to an exemplary embodiment of the present disclosure, the processor 110 may perform a calculation for learning the neural network. The processor 110 may perform calculations for learning the neural network, which include processing of input data for learning in deep learning (DL), extracting a feature in the input data, calculating an error, updating a weight of the neural network using backpropagation, and the like. At least one of the CPU, GPGPU, and TPU of the processor 110 may process learning of a network function. For example, both the CPU and the GPGPU may process the learning of the network function and data classification using the network function. Further, in an exemplary embodiment of the present disclosure, processors of a plurality of computing devices may be used together to process the learning of the network function and the data classification using the network function. Further, the computer program executed in the computing device according to an exemplary embodiment of the present disclosure may be a CPU, GPGPU, or TPU executable program.

According to an exemplary embodiment of the present disclosure, the memory 130 may store any type of information generated or determined by the processor 110 and any type of information received by the network unit 150.

According to an exemplary embodiment of the present disclosure, the memory 130 may include at least one type of storage medium of a flash memory type storage medium, a hard disk type storage medium, a multimedia card micro type storage medium, a card type memory (for example, an SD or XD memory, or the like), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk. The computing device 100 may operate in connection with a web storage performing a storing function of the memory 130 on the Internet. The description of the memory is just an example and the present disclosure is not limited thereto.

The network unit 150 according to an exemplary embodiment of the present disclosure may use an arbitrary type known wired/wireless communication systems.

The network unit 150 receives information for evaluating the placement of the semiconductor device from the external system. For example, the network unit 150 may receive connection information indicating a connection relationship between the semiconductor devices from a semiconductor related database. At this time, the connection information received from the database may be training data of the neural network model or inferring data. The connection information may include the information of the above-described example, but is not limited to the above-described example, and may be configured in various forms within a range that those skilled in the art understand.

The network unit 150 transmits and receives information processed by the processor 110 and a user interface through the communication with the other terminal. For example, the network unit 150 provides a user interface generated by the processor 110 to a client (for example, a user terminal). Further, the network unit 150 receives an external input of the user which is applied to the client to transmit the external input to the processor 110. At this time, the processor 110 processes operations of outputting, modifying, changing, or adding information which is provided through the user interface based on the external input of the user transmitted from the network unit 150.

In the meantime, the computing device 100 according to the exemplary embodiment of the present disclosure is a computing system which transmits and receives information with the client, by means of communication and includes a server. At this time, the client may be an arbitrary form of a terminal accessible to the server. For example, the computing device 100 which serves as a server receives information for evaluating placement of the semiconductor device from the external database to generate an evaluation result and provides a user interface for the evaluation result to a user terminal. At this time, the user terminal outputs the user interface received from the computing device 100 which is a server and receives or processes the information by means of the interaction with the user.

In an additional exemplary embodiment, the computing device 100 may include an arbitrary type of terminal which receives a data resource generated in an arbitrary server to perform additional information processing.

The techniques described in this specification may be used not only in the above-mentioned networks, but also in other networks.

Figure 3:
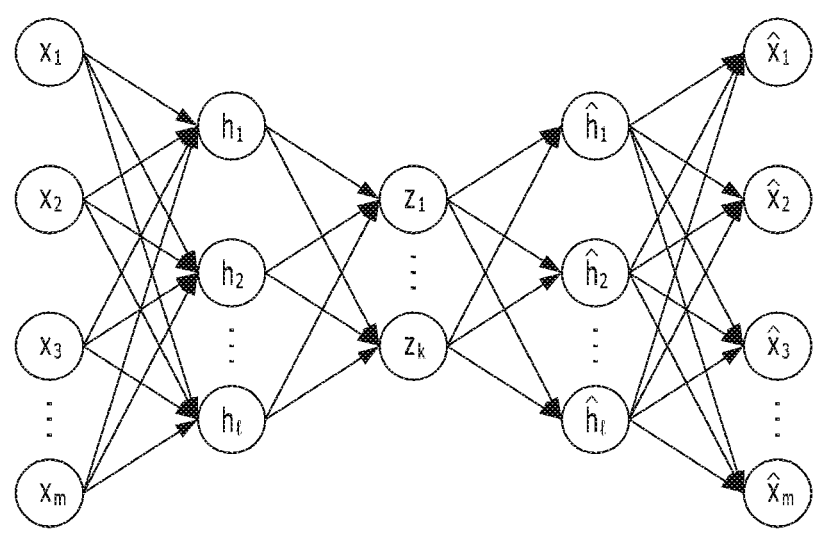
FIG. 3 is a conceptual view illustrating a neural network according to an exemplary embodiment of the present disclosure.

FIG. 3 is a schematic diagram illustrating a network function according to an exemplary embodiment of the present disclosure.

Throughout the present specification, a computation model, the neural network, a network function, and the neural network may be used as the same meaning. The neural network may be generally constituted by an aggregate of calculation units which are mutually connected to each other, which may be called nodes. The nodes may also be called neurons. The neural network is configured to include one or more nodes. The nodes (alternatively, neurons) constituting the neural networks may be connected to each other by one or more links.

In the neural network, one or more nodes connected through the link may relatively form the relationship between an input node and an output node. Concepts of the input node and the output node are relative and a predetermined node which has the output node relationship with respect to one node may have the input node relationship in the relationship with another node and vice versa. As described above, the relationship of the input node to the output node may be generated based on the link. One or more output nodes may be connected to one input node through the link and vice versa.

In the relationship of the input node and the output node connected through one link, a value of data of the output node may be determined based on data input in the input node. Here, a link connecting the input node and the output node to each other may have a weight. The weight may be variable and the weight is variable by a user or an algorithm in order for the neural network to perform a desired function. For example, when one or more input nodes are mutually connected to one output node by the respective links, the output node may determine an output node value based on values input in the input nodes connected with the output node and the weights set in the links corresponding to the respective input nodes.

As described above, in the neural network, one or more nodes are connected to each other through one or more links to form a relationship of the input node and output node in the neural network. A characteristic of the neural network may be determined according to the number of nodes, the number of links, correlations between the nodes and the links, and values of the weights granted to the respective links in the neural network. For example, when the same number of nodes and links exist and there are two neural networks in which the weight values of the links are different from each other, it may be recognized that two neural networks are different from each other.

The neural network may be constituted by a set of one or more nodes. A subset of the nodes constituting the neural network may constitute a layer. Some of the nodes constituting the neural network may constitute one layer based on the distances from the initial input node. For example, a set of nodes of which distance from the initial input node is n may constitute n layers. The distance from the initial input node may be defined by the minimum number of links which should be passed through for reaching the corresponding node from the initial input node. However, a definition of the layer is predetermined for description and the order of the layer in the neural network may be defined by a method different from the aforementioned method. For example, the layers of the nodes may be defined by the distance from a final output node.

The initial input node may mean one or more nodes in which data is directly input without passing through the links in the relationships with other nodes among the nodes in the neural network. Alternatively, in the neural network, in the relationship between the nodes based on the link, the initial input node may mean nodes which do not have other input nodes connected through the links. Similarly thereto, the final output node may mean one or more nodes which do not have the output node in the relationship with other nodes among the nodes in the neural network. Further, a hidden node may mean nodes constituting the neural network other than the initial input node and the final output node.

In the neural network according to an exemplary embodiment of the present disclosure, the number of nodes of the input layer may be the same as the number of nodes of the output layer, and the neural network may be a neural network of a type in which the number of nodes decreases and then, increases again from the input layer to the hidden layer. Further, in the neural network according to another exemplary embodiment of the present disclosure, the number of nodes of the input layer may be smaller than the number of nodes of the output layer, and the neural network may be a neural network of a type in which the number of nodes decreases from the input layer to the hidden layer. Further, in the neural network according to yet another exemplary embodiment of the present disclosure, the number of nodes of the input layer may be larger than the number of nodes of the output layer, and the neural network may be a neural network of a type in which the number of nodes increases from the input layer to the hidden layer. The neural network according to still yet another exemplary embodiment of the present disclosure may be a neural network of a type in which the neural networks are combined.

A deep neural network (DNN) may refer to a neural network that includes a plurality of hidden layers in addition to the input and output layers. When the deep neural network is used, the latent structures of data may be determined. That is, latent structures of photos, text, video, voice, and music (e.g., what objects are in the photo, what the content and feelings of the text are, what the content and feelings of the voice are) may be determined. The deep neural network may include a convolutional neural network (CNN), a recurrent neural network (RNN), an auto encoder, generative adversarial networks (GAN), a restricted Boltzmann machine (RBM), a deep belief network (DBN), a Q network, a U network, a Siam network, a Generative Adversarial Network (GAN), and the like. The description of the deep neural network described above is just an example and the present disclosure is not limited thereto.

In an exemplary embodiment of the present disclosure, the network function may include the auto encoder. The auto encoder may be a kind of artificial neural network for outputting output data similar to input data. The auto encoder may include at least one hidden layer and odd hidden layers may be disposed between the input and output layers. The number of nodes in each layer may be reduced from the number of nodes in the input layer to an intermediate layer called a bottleneck layer (encoding), and then expanded symmetrical to reduction to the output layer (symmetrical to the input layer) in the bottleneck layer. The auto encoder may perform non-linear dimensional reduction. The number of input and output layers may correspond to a dimension after preprocessing the input data. The auto encoder structure may have a structure in which the number of nodes in the hidden layer included in the encoder decreases as a distance from the input layer increases. When the number of nodes in the bottleneck layer (a layer having a smallest number of nodes positioned between an encoder and a decoder) is too small, a sufficient amount of information may not be delivered, and as a result, the number of nodes in the bottleneck layer may be maintained to be a specific number or more (e.g., half of the input layers or more).

The neural network may be learned in at least one scheme of supervised learning, unsupervised learning, semi supervised learning, or reinforcement learning. The learning of the neural network may be a process in which the neural network applies knowledge for performing a specific operation to the neural network.

The neural network may be learned in a direction to minimize errors of an output. The learning of the neural network is a process of repeatedly inputting training data into the neural network and calculating the output of the neural network for the training data and the error of a target and back-propagating the errors of the neural network from the output layer of the neural network toward the input layer in a direction to reduce the errors to update the weight of each node of the neural network. In the case of the supervised learning, the training data labeled with a correct answer is used for each training data (i.e., the labeled training data) and in the case of the unsupervised learning, the correct answer may not be labeled in each training data. That is, for example, the training data in the case of the supervised learning related to the data classification may be data in which category is labeled in each training data. The labeled training data is input to the neural network, and the error may be calculated by comparing the output (category) of the neural network with the label of the training data. As another example, in the case of the unsupervised learning related to the data classification, the training data as the input is compared with the output of the neural network to calculate the error. The calculated error is back-propagated in a reverse direction (i.e., a direction from the output layer toward the input layer) in the neural network and connection weights of respective nodes of each layer of the neural network may be updated according to the back propagation. A variation amount of the updated connection weight of each node may be determined according to a learning rate. Calculation of the neural network for the input data and the back-propagation of the error may constitute a learning cycle (epoch). The learning rate may be applied differently according to the number of repetition times of the learning cycle of the neural network. For example, in an initial stage of the learning of the neural network, the neural network ensures a certain level of performance quickly by using a high learning rate, thereby increasing efficiency and uses a low learning rate in a latter stage of the learning, thereby increasing accuracy.

In learning of the neural network, the training data may be generally a subset of actual data (i.e., data to be processed using the learned neural network), and as a result, there may be a learning cycle in which errors for the training data decrease, but the errors for the actual data increase. Overfitting is a phenomenon in which the errors for the actual data increase due to excessive learning of the training data. For example, a phenomenon in which the neural network that learns a cat by showing a yellow cat sees a cat other than the yellow cat and does not recognize the corresponding cat as the cat may be a kind of overfitting. The overfitting may act as a cause which increases the error of the machine learning algorithm. Various optimization methods may be used in order to prevent the overfitting. In order to prevent the overfitting, a method such as increasing the training data, regularization, dropout of omitting a part of the node of the network in the process of learning, utilization of a batch normalization layer, etc., may be applied.

The present disclosure provides a method for performing double clustering to place a semiconductor device in consideration of a characteristic that standard devices belonging to the same group are closely placed. For example, the present disclosure relates to a method of performing clustering on the semiconductor devices, by utilizing first reference information based on connection relationship information indicating connection relationship between the semiconductor devices and performing sub-clustering in a cluster generated by the clustering, by utilizing second reference information based on the connection relationship information, in consideration of the characteristic as described above.

Figures 4A, 4B:
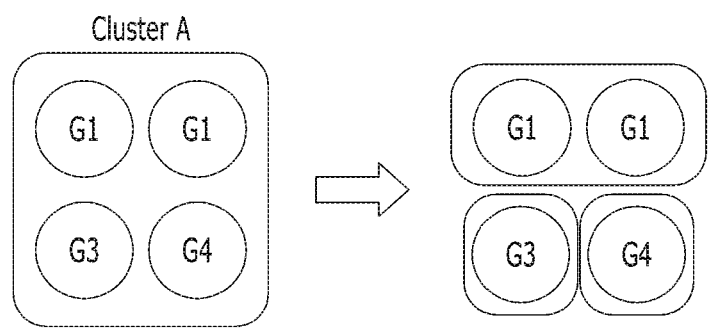
FIGS. 4A-4B are views schematically illustrating an operation of performing double clustering to place semiconductor devices according to an exemplary embodiment of the present disclosure.

FIGS. 4A-4B are views schematically illustrating an operation of performing double clustering to place semiconductor devices according to an exemplary embodiment of the present disclosure.

According to the exemplary embodiment of the present disclosure, the computing device 100 receives connection relationship information representing a connection relationship between semiconductor devices. Here, the connection relationship information includes netlist information. Further, a type of semiconductor device includes a macro device type and a standard device type. Further, the macro device type and the standard device type are classified based on a size of the device. For reference, the macro device type is one of types of devices disposed during the floorplan process and is a device which is larger than a standard device type, as a memory component. The macro cell does not have a separate specification for the size and is configured by millions of transistors to usually have a larger size than a standard cell. For example, the macro cell includes an SRAM or a CPU core. The standard cell refers to a small unit of device which is configured by one or more transistors and performs a basic function. The standard cell provides simple logical operations (for example, AND, OR, XOR) or a storage function such as flip-flops and sometimes provides more complex functions such as 2-bit full adders or multiple D-input flip-flops. Unlike the macro cell, the standard cell has a specification defined for the size.

The netlist information is considered as a set for nets representing the connectivity of semiconductor devices. The netlist information generally represents an attribute and a connection relationship of hundreds of macro cells and hundreds of thousands to millions of standard cells with hypergraph structured data. The hypergraph is a graph in which one edge expresses a connection relationship with a plurality of nodes, unlike an ordinary graph in which one edge represents a connection relationship with two nodes. The net represents that each semiconductor device receives an electrical signal from which semiconductor device and transmits an electrical signal to which device.

Referring to FIG. 4A, according to the exemplary embodiment of the present disclosure, the computing device 100 performs the clustering on the semiconductor devices by utilizing first reference information based on the connection relationship information. Here, the connection relationship information includes netlist information. For example, the computing device 100 performs the clustering on the semiconductor devices by means of a network graph clustering algorithm. According to the exemplary embodiment, the computing device 100 expresses the netlist with a hypergraph and then clusters on the semiconductor devices by utilizing group information generated by the partitioning on the hyper graph. For reference, the semiconductor devices included in the same cluster may be a group of semiconductor devices having a strong connectivity. Further, semiconductor devices belonging to the cluster which is generated by the clustering result are grouped together to be treated as a single independent device.

Even though in the drawing, only a small number of semiconductors devices is illustrated for the convenience of description, the task of evaluating the placement of hundreds of thousands to millions of semiconductor devices has a high complexity. In order to simplify the evaluation of the placement of hundreds of thousands to millions of semiconductor devices, the computing device 100 may cluster the semiconductor devices having strong connectivity. By assuming semiconductor devices included in the same cluster as one semiconductor devices by performing the clustering, the number of objects to be evaluated is reduced so that the problem complexity may be reduced. In the meantime, the operation of clustering the semiconductor devices by utilizing first reference information (connection relationship information) will be described in detail with reference to FIG. 5.

Referring to FIG. 4B, according to the exemplary embodiment of the present disclosure, the computing device 100 performs the sub-clustering in the cluster generated by the clustering by utilizing second reference information based on the connection relationship information. For example, the computing device 100 performs the clustering for every group in the cluster generated by the clustering by utilizing the first reference information again. According to the exemplary embodiment, the computing device 100 performs the sub-clustering in the cluster generated by the clustering by utilizing hierarchy information included in the netlist. In the meantime, the operation of clustering the semiconductor devices by utilizing second reference information (hierarchy information) will be described in detail with reference to FIG. 6.

According to the exemplary embodiment of the present disclosure, the computing device 100 evaluates the placement of the semiconductor device, based on a sub-cluster generated based on the double clustering including the clustering and the sub-clustering. Here, the double clustering including the clustering and the sub-clustering is performed on devices corresponding to the standard device type. Further, the computing device 100 may calculate a reward related to the placement of a sub-cluster to be placed, based on the relationship between the sub-cluster to be placed, the sub-clusters which have been already placed, and the macro devices which have been already placed.

According to the exemplary embodiment of the present disclosure, the computing device 100 improves the performance of the clustering by performing the double clustering by utilizing a characteristic of a domain of connection relationship information (netlist) defined by the hierarchy graph, rather than applying a network graph clustering algorithm which is generally used, as it is. That is, the computing device 100 evaluates the placement of the semiconductor device based on the double clustering to more accurately predict a connection relationship between the semiconductor devices with a smaller number of clusters.

Hereinafter, an operation of placing the semiconductor device based on a sub-cluster generated based on the double clustering including the clustering and the sub-clustering will be described in detail with reference to FIGS. 5 to 7.

Figure 5:
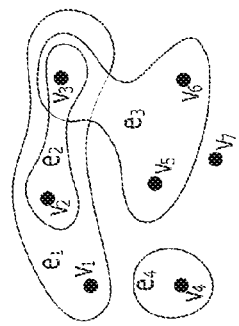
FIG. 5 is a view schematically illustrating an operation of clustering semiconductor devices according to an exemplary embodiment of the present disclosure.

FIG. 5 is a view schematically illustrating an operation of clustering semiconductor devices according to an exemplary embodiment of the present disclosure.

According to the exemplary embodiment of the present disclosure, the computing device 100 performs the clustering on the semiconductor devices by utilizing first reference information based on the connection relationship information. In other words, the computing device 100 performs the clustering on the semiconductor devices by utilizing first reference information based on the netlist (connection relationship information). Here, the first reference information based on the connection relationship information expresses the netlist with a hypergraph and then includes group information generated by the partitioning on the hypergraph. For example, the hypergraph structure corresponds to a many-to-many structure in which a drive cell corresponding to an input device and a load cell corresponding to an output device are connected to one edge. For reference, the clustering refers to a method of efficiently expressing the connection relationship information (netlist) expressed by the hypergraph by dividing the connection relationship information into some groups.

To be more specific, referring to FIG. 5, the computing device 100 expresses the connection relationship information (netlist) by the hypergraph (S10). For example, the hypergraph is a graph which represents a connection relationship of a plurality of vertices on one edge. Further, the computing device 100 partitions the connection relationship information (netlist) into n regions (S20). Further, the computing device 100 simplifies the connection relationship information (netlist) by processing each partition as one group (S30). The computing device 100 groups semiconductor devices belonging to each cluster generated as the clustering result (for example, as one group) to be treated as one independent semiconductor device.

Figure 6:
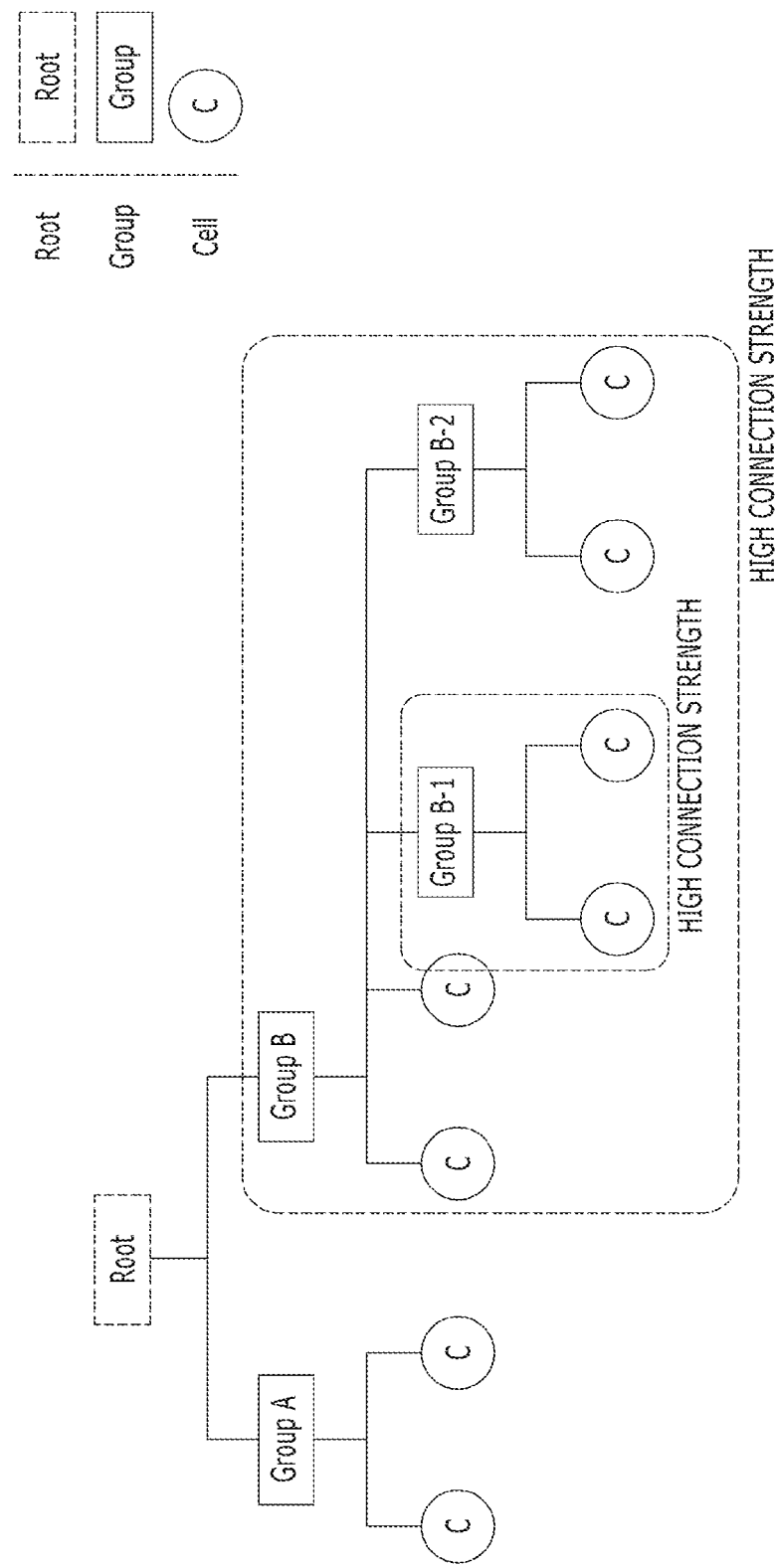
FIG. 6 is a view schematically illustrating hierarchy information on a netlist according to an exemplary embodiment of the present disclosure.

FIG. 6 is a view schematically illustrating hierarchy information on a netlist according to an exemplary embodiment of the present disclosure.

According to the exemplary embodiment of the present disclosure, the computing device 100 performs the sub-clustering in the cluster generated by the clustering by utilizing second reference information based on the connection relationship information. Here, the second reference information based on the connection relationship information includes hierarchy information included in the netlist. For example, referring to FIG. 6, the hierarchy information includes information about a root corresponding to a first level, Group A and Group B corresponding to second level, or semiconductor devices (cell), Group B-1, Group B-2 corresponding to a lower level of Group A or Group B. For example, the group includes the semiconductor devices belonging to the same layer in the netlist.

To be more specific, for example, the computing device 100 acquires hierarchy information on the netlist, with respect to each of the devices included in the cluster. For example, one netlist is configured by a hierarchy and the semiconductor devices (cell) included in the same group has a high connection strength. For example, referring to FIG. 6, semiconductor devices (cell) included in Group B has a high connection strength and semiconductor devices (cell) included in Group B-1 belonging to the lower level also has a high connection strength. Further, the computing device 100 identifies devices which are classified into the same group in the hierarchy on the netlist, among devices included in the cluster. For example, referring to FIG. 4A, the computing device 100 identifies devices which are classified into the same group, {G1, G1}, {G3}, {G4} in the hierarchy on the netlist, among devices (for example, G1, G1, G3, and G4) included in the first cluster (Cluster A). Further, the computing device 100 generates a sub-cluster including the identified devices. For reference, referring to FIG. 4B, the computing device 100 generates a first sub-cluster including {G1, G1}, a second sub-cluster including {G3}, and a third sub-cluster including {G4}. The generated sub-cluster includes devices which are classified into the same group in the hierarchy on the netlist.

According to the exemplary embodiment of the present disclosure, the computing device 100 evaluates the placement of the semiconductor device, based on a sub-cluster generated based on the double clustering including the clustering and the sub-clustering. Here, the double clustering including the clustering and the sub-clustering is performed on devices corresponding to the standard device type. For example, devices corresponding to a macro device type having a relatively larger size may be preferentially placed to devices corresponding to a standard device type having a smaller size. Only after performing the design process with a dedicated electronic design automation (EDA) tool after placing the macro-type device, the evaluation for the placement can be performed. Therefore, the double clustering including the clustering and the sub-clustering may be performed on devices corresponding to the standard device type.

The computing device 100 may calculate a reward related to the placement of a sub-cluster to be placed, based on the relationship between the sub-cluster to be placed, the sub-clusters which have been already placed, and the macro devices which have been already placed. To be more specific, the computing device 100 acquires a sub-cluster to be placed. Further, the computing device 100 may calculate a reward related to the placement of a sub-cluster to be placed, based on the relationship between the sub-cluster to be placed, the sub-clusters which have been already placed, and the macro devices which have been already placed. For example, the reward related to the placement of the sub-cluster to be placed may include at least one reward of a reward based on an optimization algorithm or a reward based on the reinforcement learning. Further, the reward related to the placement of the sub-cluster to be placed may be calculated by assuming each of the placed sub-cluster and the sub-clusters which have been already placed as a single device.

For example, the computing device 100 performs an operation about a wire length and a congestion for the sub-cluster to be placed. For example, the sub-cluster to be placed includes a first semiconductor device, a second semiconductor device, and a third semiconductor device and the semiconductor devices included in the same sub-cluster are assumed as one semiconductor device. Accordingly, the operation on the wire length and the congestion to determine the reward does not need to be repeatedly performed on the semiconductor devices included in the same sub-cluster.

According to the exemplary embodiment of the present disclosure, the computing device 100 may determine at least one reward of a reward based on the optimization algorithm or a reward based on the reinforcement learning, based on one assumed semiconductor device. At this time, the reward may be determined based on at least one of a length of a wire which connects the semiconductor devices calculated in consideration of the semiconductor device assumed by the sub-clustering and the congestion of the semiconductor devices calculated in consideration of the semiconductor device assumed through the sub-clustering. For example, the reward may be calculated as a weighted sum of the wire length and the congestion. The reward which is calculated as the weighted sum of the wire length and the congestion calculated in consideration of the semiconductor device assumed through the sub-clustering is expressed by the following Equation 1.

$$R_{nets} = -\alpha W(\text{nets}) - \beta C(\text{nets}) \quad \text{[Equation 1]}$$

Here, nets indicate a connection relationship including information about the sub-clustering. $R_{nets}$ is a reward, $\alpha$ and $\beta$ are coefficients for adjusting the entire scale, W(nets) is a length of a wire connecting semiconductor devices calculated in consideration of the semiconductor device assumed by the sub-clustering, and C(nets) is a congestion connecting semiconductor devices calculated in consideration of the semiconductor device assumed by the sub-clustering. As represented in Equation 1, the reward of the present disclosure may be derived by the weighted sum which flexibly adjusts a length of the wire and a magnitude of the congestion by the coefficients.

According to the exemplary embodiment of the present disclosure, the length of the wire may include a sum of a length of a wire calculated between the semiconductor device assumed by the sub-clustering to be placed and a sub-cluster which has already placed and a fixed value of a length of the wire calculated between the semiconductor devices in the sub-clustering to be placed. The length of the wire may be expressed by the following Equation 2.

$$\text{Wirelength}_{(nets)} = \Sigma \text{Wirelength}(net_{clustered}) + \Sigma \text{Wirelength}(\text{nets}_{ingle\_clustered}) \quad \text{[Equation 2]}$$

Here, $net_{clustered}$ may be a relationship between a semiconductor device assumed by the sub-clustering to be placed and sub-clusters which have been already placed. In other words, $net_{clustered}$ may be a case in which some of the plurality of semiconductor devices connected to a specific net is included in the sub-cluster. net$_{single\_clustered}$ may be a relationship between semiconductor devices in the sub-clustering. In other words, net$_{single\_clustered}$ may be a case in which all the semiconductor devices connected to a specific net are included in the one sub-cluster. The fixed value of the wire length always has the same value regardless of the placement location of the semiconductor device so that it does not need to calculate the wire length again after initially calculating the wire length.

According to the exemplary embodiment of the present disclosure, the length of the wire may be calculated half the perimeter of the area in which devices having the connection relationship are disposed. For example, when it is assumed that there is one net (that is, devices which are completed to be placed in a predetermined area of the canvas) which is completely placed device in one rectangular area, a half the perimeter of the rectangular area including the net is estimated as the length of the wire. The computing device 100 may perform the above-described calculation on the semiconductor device assumed through the sub-clustering and then estimate the total sum as a length of the wire.

According to the exemplary embodiment of the present disclosure, the congestion may include a sum of the congestions calculated between the semiconductor device assumed by the sub-clustering and sub-clusters which have been already placed and a fixed value of the congestion calculated between the semiconductor devices in the sub-clustering. The congestion may be expressed by the following Equation 3.

$$\text{congestion}_{(nets)} = \Sigma\text{Congestion}(net_{clustered}) + \Sigma\text{Congestion}(net_{single\_clustered}) \quad \text{[Equation 3]}$$

Here, net$_{clustered}$ may be a relationship between a semiconductor device assumed by the sub-clustering to be placed and sub-clusters which have been already placed. In other words, net$_{clustered}$ may be a case in which some of the plurality of semiconductor devices connected to a specific net is included in the sub-cluster. net$_{single\_clustered}$ may be a relationship between semiconductor devices in the sub-cluster. In other words, net$_{single\_clustered}$ may be a case in which all the semiconductor devices connected to a specific net are included in the one sub-cluster. The fixed value of the wire length always has the same value regardless of the placement location of the semiconductor device so that it does not need to calculate the wire length again after initially calculating the wire length. The fixed value of the wire length and the fixed value of the congestion always have the same value regardless of the placement location so that the fixed values do not need to be calculated again after the initial calculation.

According to the exemplary embodiment of the present disclosure, the congestion may be calculated by a ratio of a second routing resource which represents a demand resource for connecting the semiconductor devices disposed in the canvas by a wire to a first routing resource which represents a supply resource in which a wire is allocated for every area of the canvas. For example, the congestion may be expressed by the following Equation 4.

$$C(v) = \text{demand}(v)/\text{supply}(v) \quad \text{[Equation 4]}$$

Here, v is a grid cell which is a basic unit of the canvas area. C(v) represents a congestion, supply(v) represents a first routing resource provided by the grid cell of the canvas, and demand(v) represents a second routing resource demanded to connect semiconductor devices by a wire. According to Equation 4, the congestion is proportional to the second routing resource so that it is expected that the second routing resource is reduced to lower the entire congestion.

Figure 7:
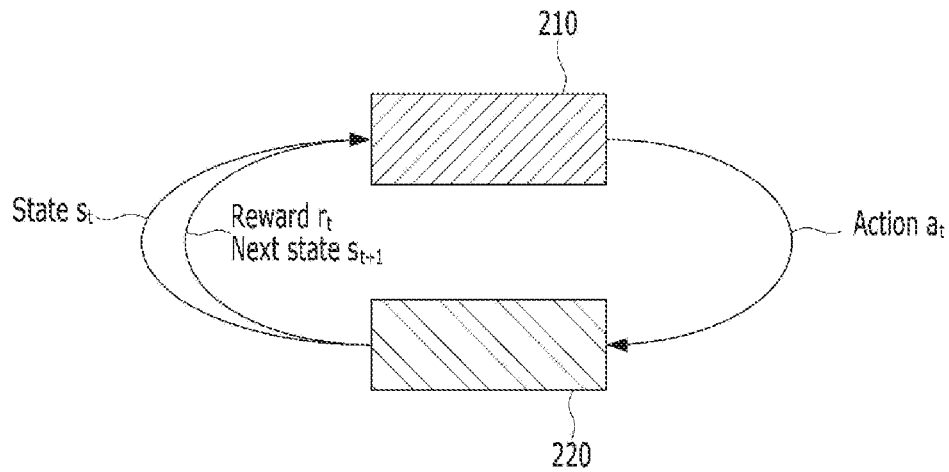
FIG. 7 is a conceptual diagram illustrating a reinforcement learning process according to an exemplary embodiment of the present disclosure.

FIG. 7 is a conceptual diagram illustrating a reinforcement learning process according to an exemplary embodiment of the present disclosure.

For example, referring to FIG. 7, the reinforcement learning is a learning method which trains the neural network model based on a reward calculated for an action selected by the neural network model to allow the neural network model to determine a better action based on a state. The state is a set of values representing how the situation is at the current timing and is understood as an input of the neural network model. The action refers to a decision according to an option to be taken by the neural network model and is understood as an output of the neural network model. The reward refers to a benefit followed when the neural network model performs any action and represents an immediate value for evaluating the current state and the action. The reinforcement learning is understood as learning through trial and error because the decision (that is, action) is rewarded. A reward given to the neural network model during the reinforcement learning process, may be a reward obtained by accumulating results of a plurality of actions. A neural network model which makes the return such as a reward itself or a total of rewards maximum in consideration of the reward according to several states and actions may be generated by the reinforcement learning. In the present disclosure, the neural network model may be interchangeably used with a term "agent" which is a subject that makes a decision on what action to take according to the surrounding state. Referring to FIG. 7, in the reinforcement learning, there is an environment 220 to which the agent 210 belongs. The environment 220 may be understood to indicate the setting for the reinforcement learning of the agent 210. When the agent 210 acts, the state is changed by the environment 220, and the agent 210 may be rewarded. A goal of the reinforcement learning is to train the agent 210 to get as many rewards as possible in the given environment 220.

According to the exemplary embodiment of the present disclosure, the reward may be determined based on one semiconductor device assumed for a plurality of semiconductor devices included in the same cluster based on the clustering. The computing device 100 performs the reinforcement learning in consideration of the previously-described reward.

According to the exemplary embodiment of the present disclosure, the computing device 100 may train the neural network model by means of the reinforcement learning based on a state which includes connection information representing a connection relationship between semiconductor devices, an action that disposes the semiconductor device in the canvas, and a reward determined by the process as described above. The computing device 100 causes the neural network model to perform the action to dispose one semiconductor device per one cycle in the canvas and returns the reward according to the action together with the state to allow the neural network model to perform the action according to the subsequent cycle to perform the reinforcement learning for the neural network model. For example, the computing device 100 may perform the action at a specific timing t to dispose the semiconductor device in the canvas based on the state at the specific timing t, through the neural network model. The computing device 100 estimates a reward at a next timing t+1 for the action at the specific timing t and returns the estimated reward to the neural network model. The computing device 100 performs the action at the next timing t+1 by inputting the state and the reward at the next timing t+1 to the neural network model as an input. The computing device 100 repeats the cycle to perform the reinforcement learning for the neural network model to optimize the PPA which is an evaluation index of the logical design of the semiconductor.

According to the exemplary embodiment of the present disclosure, the computing device 100 partitions the cluster by utilizing electronic design automation (EDA) tool information. For example, the computing device 100 may simulate the placement of the semiconductor device by utilizing electronic design automation (EDA) software. In other words, the computing device 100 may coarsely simulate the placement of the semiconductor device by utilizing electronic design automation (EDA) software. Further, the computing device 100 partitions the sub-cluster generated by the sub-clustering, based on the simulation result which utilizes the EDA software. To be more specific, the computing device 100 acquires distance information between the devices included in the sub-cluster, based on the simulation result. For example, the distance information includes coarse physical distance information calculated by utilizing the EDA software. Further, the computing device 100 partitions devices included in the sub-cluster based on the acquired distance information to generate two or more new sub-clusters. That is, the computing device 100 additionally partitions the devices included in the same sub-cluster by utilizing the distance information (that is, distance information calculated by utilizing EDA software) and thus more improves the accuracy of the generation of the sub-cluster. For example, the computing device 100 separately partitions devices whose distance information is calculated as a distance which is equal to or larger than the threshold, among the devices included in the same sub-cluster to generate an additional sub-cluster to further improve the accuracy for generating the sub-cluster (that is, an accuracy of allowing devices to be actually placed to be adjacent to be included in the same sub-cluster).

Hereinafter, an operation flow of the present disclosure will be described in brief based on the above detailed description.

Figure 8:
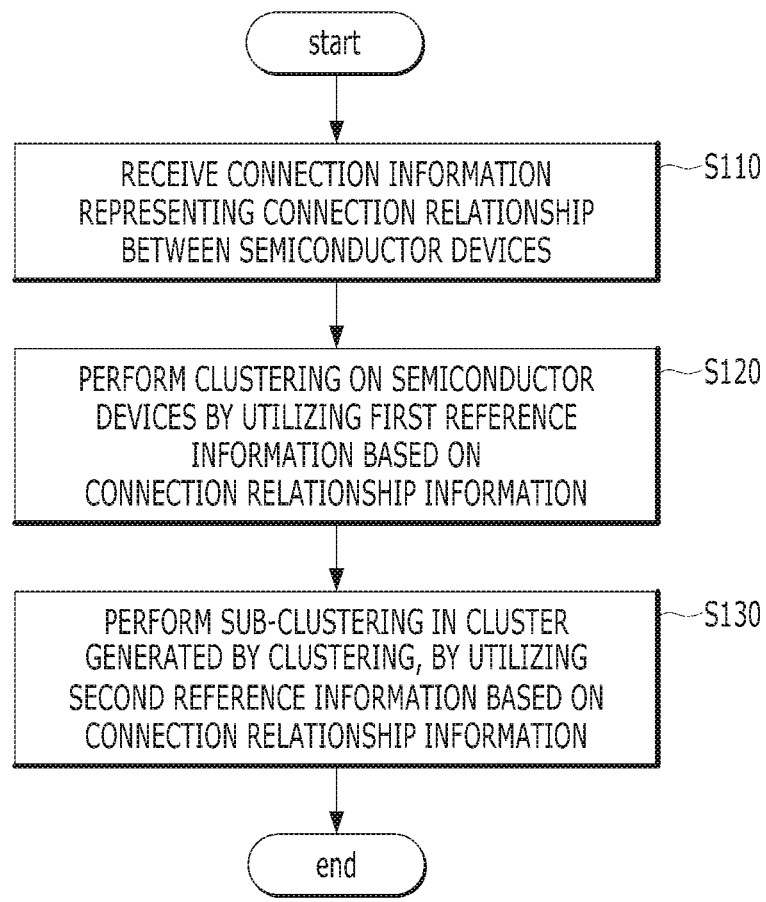
FIG. 8 is a flowchart illustrating a method for performing double clustering to place semiconductor devices according to an exemplary embodiment of the present disclosure.

FIG. 8 is a flowchart illustrating a method for performing double clustering to place semiconductor devices according to an exemplary embodiment of the present disclosure.

A method for performing double clustering to place semiconductor devices illustrated in FIG. 8 may be performed by the above-described computing device 100. Therefore, even though some contents are omitted, the contents which have been described for the computing device 100 may be applied to the description of the method for performing double clustering to place semiconductor devices in the same way.

According to the exemplary embodiment of the present disclosure, the method for performing double clustering to evaluate placement of semiconductor devices includes a step S110 of receiving connection relationship information representing a connection relationship between semiconductor devices; a step S120 of performing clustering on the semiconductor devices by utilizing first reference information based on the connection relationship information; and a step S130 of performing sub-clustering in a cluster generated by the clustering, by utilizing second reference information based on the connection relationship information. Further, the method for performing double clustering to evaluate placement of semiconductor devices according to the exemplary embodiment of the present disclosure is performed by the computing device 100.

The step S110 is a step of receiving connection relationship information representing a connection relationship between semiconductor devices. Here, the connection relationship information includes netlist.

The step S120 is a step of clustering the semiconductor devices by utilizing first reference information based on the connection relationship information. Here, the first reference information based on the connection relationship information expresses the netlist with a hypergraph and then includes group information generated by the partitioning on the hypergraph.

The step S130 is a step of performing sub-clustering in a cluster generated by the clustering, by utilizing second reference information based on the connection relationship information. Here, the second reference information based on the connection relationship information includes hierarchy information included in the netlist.

In the meantime, the method for performing double clustering to place semiconductor devices according to the exemplary embodiment of the present disclosure further includes a step of evaluating the placement of the semiconductor devices based on a sub-cluster generated based on the double clustering including the clustering and the sub-clustering. Here, the type of semiconductor device includes a macro device type and a standard device type and the macro device type and the standard device type are classified based on a device size.

In the above-description, steps S110 to S130 may be further divided into additional steps or combined as smaller steps depending on an implementation example of the present disclosure. Further, some steps may be omitted if necessary and the order of steps may be changed.

Figure 9:
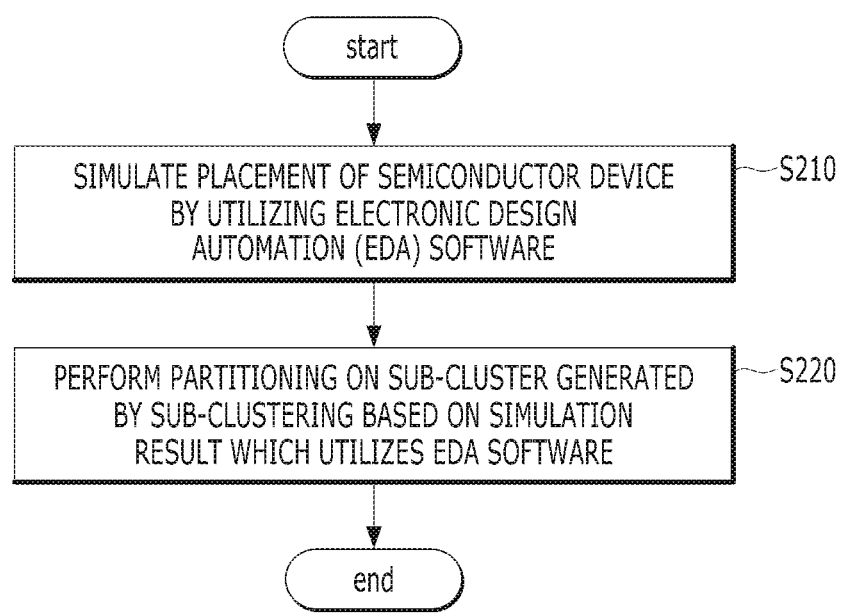
FIG. 9 is a flowchart illustrating a method for partitioning a sub-cluster generated by sub-clustering based on a simulation result which utilizes EDA software according to an exemplary embodiment of the present disclosure.

FIG. 9 is a flowchart illustrating a method for partitioning a sub-cluster generated by sub-clustering based on a simulation result which utilizes EDA software according to an exemplary embodiment of the present disclosure.

Referring to FIG. 9, a method for partitioning a sub-cluster generated by sub-clustering based on a simulation result which utilizes EDA software according to an exemplary embodiment of the present disclosure includes a step S210 of simulating placement of a semiconductor device by utilizing electronic design automation (EDA) software, and a step S220 of partitioning the sub-cluster generated by the sub-clustering based on a result of the simulation utilizing the EDA software. Further, the method for partitioning a sub-cluster generated by the sub-clustering based on a simulation result which utilizes EDA software according to an exemplary embodiment of the present disclosure may be performed by the computing device 100.

The step S210 is a step of simulating placement of a semiconductor device by utilizing electronic design automation (EDA) software. In the step S210, the semiconductor device may be coarsely placed using an EDA tool.

The step S220 is a step of partitioning the sub-cluster generated by the sub-clustering based on a result of the simulation utilizing the EDA software. The step S220 includes a step of acquiring distance information between devices included in the sub-cluster, based on the simulation result; and a step of generating two or more new sub-clusters by partitioning devices included in the sub-cluster based on the acquired distance information. In other words, in the step S220, the result of the simulation performed in the step S210 is utilized and when the distance information between devices included in the cluster is equal to or larger than predetermined distance information, the devices included in the cluster are partitioned to generate two or more new clusters. For example, the distance information includes coarse physical distance information calculated by utilizing the EDA software.

According to the exemplary embodiment of the present disclosure, in order to solve the problem in that an approximation error occurs during a process of simplifying netlist information through the clustering and the placement performance of the semiconductor device is degraded due to this problem, the computing device 100 performs operations of acquiring distance information between devices included in the sub-cluster, and partitioning devices included in the sub-cluster based on the acquired distance information to generate two or more new sub-clusters.

In the above description, the steps S210 to S220 may be further divided into additional steps or combined as smaller steps depending on an implementation example of the present disclosure. Further, some steps may be omitted if necessary and the order of steps may be changed.

In the meantime, according to an embodiment of the present disclosure, a computer readable medium storing a data structure is disclosed.

The data structure may refer to organization, management, and storage of data that enable efficient access and modification of data. The data structure may refer to organization of data for solving a specific problem (for example, data search, data storage, and data modification in the shortest time). The data structure may also be defined with a physical or logical relationship between the data elements designed to support a specific data processing function. A logical relationship between data elements may include a connection relationship between user defined data elements. A physical relationship between data elements may include an actual relationship between the data elements physically stored in a computer readable storage medium (for example, a permanent storage device). In particular, the data structure may include a set of data, a relationship between data, and a function or a command applicable to data. Through the effectively designed data structure, the computing device may perform a calculation while minimally using resources of the computing device. In particular, the computing device may improve efficiency of calculation, reading, insertion, deletion, comparison, exchange, and search through the effectively designed data structure.

The data structure may be divided into a linear data structure and a non-linear data structure according to the form of the data structure. The linear data structure may be the structure in which only one data is connected after one data. The linear data structure may include a list, a stack, a queue, and a deque. The list may mean a series of dataset in which order exists internally. The list may include a linked list. The linked list may have a data structure in which data is connected in a method in which each data has a pointer and is linked in a single line. In the linked list, the pointer may include information about the connection with the next or previous data. The linked list may be expressed as a single linked list, a double linked list, and a circular linked list according to the form. The stack may have a data listing structure with limited access to data. The stack may have a linear data structure that may process (for example, insert or delete) data only at one end of the data structure. The data stored in the stack may have a data structure (Last In First Out, LIFO) in which the later the data enters, the sooner the data comes out. The queue is a data listing structure with limited access to data, and may have a data structure (First In First Out, FIFO) in which the later the data is stored, the later the data comes out, unlike the stack. The deque may have a data structure that may process data at both ends of the data structure.

The non-linear data structure may be the structure in which the plurality of data is connected after one data. The non-linear data structure may include a graph data structure. The graph data structure may be defined with a vertex and an edge, and the edge may include a line connecting two different vertexes. The graph data structure may include a tree data structure. The tree data structure may be the data structure in which a path connecting two different vertexes among the plurality of vertexes included in the tree is one. That is, the tree data structure may be the data structure in which a loop is not formed in the graph data structure.

Throughout the present specification, a calculation model, a nerve network, the network function, and the neural network may be used with the same meaning. Hereinafter, the terms of the calculation model, the nerve network, the network function, and the neural network are unified and described with a neural network. The data structure may include a neural network. Further, the data structure including the neural network may be stored in a computer readable medium. The data structure including the neural network may also include preprocessed data for processing by the neural network, data input to the neural network, a weight of the neural network, a hyper-parameter of the neural network, data obtained from the neural network, an active function associated with each node or layer of the neural network, and a loss function for training of the neural network. The data structure including the neural network may include predetermined configuration elements among the disclosed configurations. That is, the data structure including the neural network may include the entirety or a predetermined combination of pre-processed data for processing by neural network, data input to the neural network, a weight of the neural network, a hyper parameter of the neural network, data obtained from the neural network, an active function associated with each node or layer of the neural network, and a loss function for training the neural network. In addition to the foregoing configurations, the data structure including the neural network may include predetermined other information determining a characteristic of the neural network. Further, the data structure may include all type of data used or generated in a computation process of the neural network, and is not limited to the foregoing matter. The computer readable medium may include a computer readable recording medium and/or a computer readable transmission medium. The neural network may be formed of a set of interconnected calculation units which are generally referred to as "nodes". The "nodes" may also be called "neurons." The neural network consists of one or more nodes.

The data structure may include data input to the neural network. The data structure including the data input to the neural network may be stored in the computer readable medium. The data input to the neural network may include training data input in the training process of the neural network and/or input data input to the training completed neural network. The data input to the neural network may include data that has undergone pre-processing and/or data to be pre-processed. The pre-processing may include a data processing process for inputting data to the neural network. Accordingly, the data structure may include data to be pre-processed and data generated by the pre-processing. The foregoing data structure is merely an example, and the present disclosure is not limited thereto.

The data structure may include a weight of the neural network (in the present specification, weights and parameters may be used with the same meaning), Further, the data structure including the weight of the neural network may be stored in the computer readable medium. The neural network may include a plurality of weights. The weight is variable, and in order for the neural network to perform a desired function, the weight may be varied by a user or an algorithm. For example, when one or more input nodes are connected to one output node by links, respectively, the output node may determine a data value output from the output node based on values input to the input nodes connected to the output node and the weight set in the link corresponding to each of the input nodes. The foregoing data structure is merely an example, and the present disclosure is not limited thereto.

For a non-limited example, the weight may include a weight varied in the neural network training process and/or the weight when the training of the neural network is completed. The weight varied in the neural network training process may include a weight at a time at which a training cycle starts and/or a weight varied during a training cycle. The weight when the training of the neural network is completed may include a weight of the neural network completing the training cycle. Accordingly, the data structure including the weight of the neural network may include the data structure including the weight varied in the neural network training process and/or the weight when the training of the neural network is completed. Accordingly, it is assumed that the weight and/or a combination of the respective weights are included in the data structure including the weight of the neural network. The foregoing data structure is merely an example, and the present disclosure is not limited thereto.

The data structure including the weight of the neural network may be stored in the computer readable storage medium (for example, a memory and a hard disk) after undergoing a serialization process. The serialization may be the process of storing the data structure in the same or different computing devices and converting the data structure into a form that may be reconstructed and used later. The computing device may serialize the data structure and transceive the data through a network. The serialized data structure including the weight of the neural network may be reconstructed in the same or different computing devices through deserialization. The data structure including the weight of the neural network is not limited to the serialization. Further, the data structure including the weight of the neural network may include a data structure (for example, in the non-linear data structure, B-Tree, Trie, m-way search tree, AVL tree, and Red-Black Tree) for improving efficiency of the calculation while minimally using the resources of the computing device. The foregoing matter is merely an example, and the present disclosure is not limited thereto.

The data structure may include a hyper-parameter of the neural network. The data structure including the hyper-parameter of the neural network may be stored in the computer readable medium. The hyper-parameter may be a variable varied by a user. The hyper-parameter may include, for example, a learning rate, a cost function, the number of times of repetition of the training cycle, weight initialization (for example, setting of a range of a weight value to be weight-initialized), and the number of hidden units (for example, the number of hidden layers and the number of nodes of the hidden layer). The foregoing data structure is merely an example, and the present disclosure is not limited thereto.

Figure 10:
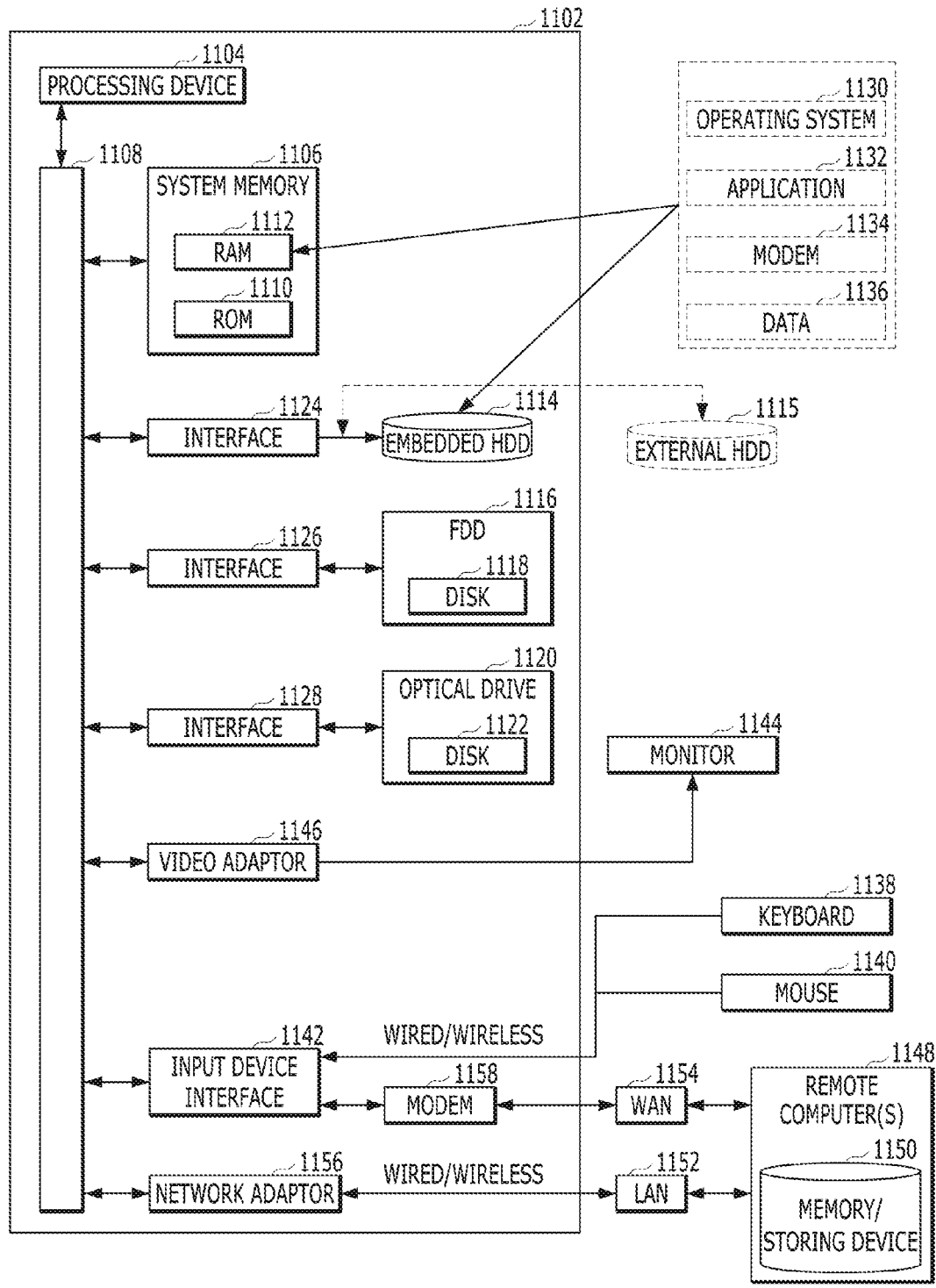
FIG. 10 illustrates a simple and general schematic view of an exemplary computing environment in which exemplary embodiments of the present disclosure are embodied.

FIG. 10 is a simple and general schematic diagram illustrating an example of a computing environment in which the embodiments of the present disclosure are implementable.

The present disclosure has been described as being generally implementable by the computing device, but those skilled in the art will appreciate well that the present disclosure is combined with computer executable commands and/or other program modules executable in one or more computers and/or be implemented by a combination of hardware and software.

In general, a program module includes a routine, a program, a component, a data structure, and the like performing a specific task or implementing a specific abstract data form. Further, those skilled in the art will well appreciate that the method of the present disclosure may be carried out by a personal computer, a hand-held computing device, a microprocessor-based or programmable home appliance (each of which may be connected with one or more relevant devices and be operated), and other computer system configurations, as well as a single-processor or multiprocessor computer system, a mini computer, and a main frame computer.

The embodiments of the present disclosure may be carried out in a distribution computing environment, in which certain tasks are performed by remote processing devices connected through a communication network. In the distribution computing environment, a program module may be located in both a local memory storage device and a remote memory storage device.

The computer generally includes various computer readable media. The computer accessible medium may be any type of computer readable medium, and the computer readable medium includes volatile and non-volatile media, transitory and non-transitory media, and portable and non-portable media. As a non-limited example, the computer readable medium may include a computer readable storage medium and a computer readable transport medium. The computer readable storage medium includes volatile and non-volatile media, transitory and non-transitory media, and portable and non-portable media constructed by a predetermined method or technology, which stores information, such as a computer readable command, a data structure, a program module, or other data. The computer readable storage medium includes a RAM, a Read Only Memory (ROM), an Electrically Erasable and Programmable ROM (EEPROM), a flash memory, or other memory technologies, a Compact Disc (CD)-ROM, a Digital Video Disk (DVD), or other optical disk storage devices, a magnetic cassette, a magnetic tape, a magnetic disk storage device, or other magnetic storage device, or other predetermined media, which are accessible by a computer and are used for storing desired information, but is not limited thereto.

The computer readable transport medium generally implements a computer readable command, a data structure, a program module, or other data in a modulated data signal, such as a carrier wave or other transport mechanisms, and includes all of the information transport media. The modulated data signal means a signal, of which one or more of the characteristics are set or changed so as to encode information within the signal. As a non-limited example, the computer readable transport medium includes a wired medium, such as a wired network or a direct-wired connection, and a wireless medium, such as sound, Radio Frequency (RF), infrared rays, and other wireless media. A combination of the predetermined media among the foregoing media is also included in a range of the computer readable transport medium.

An illustrative environment 1100 including a computer 1102 and implementing several aspects of the present disclosure is illustrated, and the computer 1102 includes a processing device 1104, a system memory 1106, and a system bus 1108. The system bus 1108 connects system components including the system memory 1106 (not limited) to the processing device 1104. The processing device 1104 may be a predetermined processor among various commonly used processors. A dual processor and other multi-processor architectures may also be used as the processing device 1104.

The system bus 1108 may be a predetermined one among several types of bus structure, which may be additionally connectable to a local bus using a predetermined one among a memory bus, a peripheral device bus, and various common bus architectures. The system memory 1106 includes a ROM 1110, and a RAM 1112. A basic input/output system (BIOS) is stored in a non-volatile memory 1110, such as a ROM, an EPROM, and an EEPROM, and the BIOS includes a basic routing helping a transport of information among the constituent elements within the computer 1102 at a time, such as starting. The RAM 1112 may also include a high-rate RAM, such as a static RAM, for caching data.

The computer 1102 also includes an embedded hard disk drive (HDD) 1114 (for example, enhanced integrated drive electronics (EIDE) and serial advanced technology attachment (SATA))—the embedded HDD 1114 being configured for exterior mounted usage within a proper chassis (not illustrated)—a magnetic floppy disk drive (FDD) 1116 (for example, which is for reading data from a portable diskette 1118 or recording data in the portable diskette 1118), and an optical disk drive 1120 (for example, which is for reading a CD-ROM disk 1122, or reading data from other high-capacity optical media, such as a DVD, or recording data in the high-capacity optical media). A hard disk drive 1114, a magnetic disk drive 1116, and an optical disk drive 1120 may be connected to a system bus 1108 by a hard disk drive interface 1124, a magnetic disk drive interface 1126, and an optical drive interface 1128, respectively. An interface 1124 for implementing an outer mounted drive includes, for example, at least one of or both a universal serial bus (USB) and the Institute of Electrical and Electronics Engineers (IEEE) 1394 interface technology.

The drives and the computer readable media associated with the drives provide non-volatile storage of data, data structures, computer executable commands, and the like. In the case of the computer 1102, the drive and the medium correspond to the storage of random data in an appropriate digital form. In the description of the computer readable media, the HDD, the portable magnetic disk, and the portable optical media, such as a CD, or a DVD, are mentioned, but those skilled in the art will well appreciate that other types of computer readable media, such as a zip drive, a magnetic cassette, a flash memory card, and a cartridge, may also be used in the illustrative operation environment, and the predetermined medium may include computer executable commands for performing the methods of the present disclosure.

A plurality of program modules including an operation system 1130, one or more application programs 1132, other program modules 1134, and program data 1136 may be stored in the drive and the RAM 1112. An entirety or a part of the operation system, the application, the module, and/or data may also be cached in the RAM 1112. It will be well appreciated that the present disclosure may be implemented by several commercially usable operation systems or a combination of operation systems.

A user may input a command and information to the computer 1102 through one or more wired/wireless input devices, for example, a keyboard 1138 and a pointing device, such as a mouse 1140. Other input devices (not illustrated) may be a microphone, an IR remote controller, a joystick, a game pad, a stylus pen, a touch screen, and the like. The foregoing and other input devices are frequently connected to the processing device 1104 through an input device interface 1142 connected to the system bus 1108, but may be connected by other interfaces, such as a parallel port, an IEEE 1394 serial port, a game port, a USB port, an IR interface, and other interfaces.

A monitor 1144 or other types of display devices are also connected to the system bus 1108 through an interface, such as a video adaptor 1146. In addition to the monitor 1144, the computer generally includes other peripheral output devices (not illustrated), such as a speaker and a printer.

The computer 1102 may be operated in a networked environment by using a logical connection to one or more remote computers, such as remote computer(s) 1148, through wired and/or wireless communication. The remote computer(s) 1148 may be a work station, a computing device computer, a router, a personal computer, a portable computer, a microprocessor-based entertainment device, a peer device, and other general network nodes, and generally includes some or an entirety of the constituent elements described for the computer 1102, but only a memory storage device 1150 is illustrated for simplicity. The illustrated logical connection includes a wired/wireless connection to a local area network (LAN) 1152 and/or a larger network, for example, a wide area network (WAN) 1154. The LAN and WAN networking environments are general in an office and a company, and make an enterprise-wide computer network, such as an Intranet, easy, and all of the LAN and WAN networking environments may be connected to a worldwide computer network, for example, the Internet.

When the computer 1102 is used in the LAN networking environment, the computer 1102 is connected to the local network 1152 through a wired and/or wireless communication network interface or an adaptor 1156. The adaptor 1156 may make wired or wireless communication to the LAN 1152 easy, and the LAN 1152 also includes a wireless access point installed therein for the communication with the wireless adaptor 1156. When the computer 1102 is used in the WAN networking environment, the computer 1102 may include a modem 1158, is connected to a communication computing device on a WAN 1154, or includes other means setting communication through the WAN 1154 via the Internet. The modem 1158, which may be an embedded or outer-mounted and wired or wireless device, is connected to the system bus 1108 through a serial port interface 1142. In the networked environment, the program modules described for the computer 1102 or some of the program modules may be stored in a remote memory/storage device 1150. The illustrated network connection is illustrative, and those skilled in the art will appreciate well that other means setting a communication link between the computers may be used.

The computer 1102 performs an operation of communicating with a predetermined wireless device or entity, for example, a printer, a scanner, a desktop and/or portable computer, a portable data assistant (PDA), a communication satellite, predetermined equipment or place related to a wirelessly detectable tag, and a telephone, which is disposed by wireless communication and is operated. The operation includes a wireless fidelity (Wi-Fi) and Bluetooth wireless technology at least. Accordingly, the communication may have a pre-defined structure, such as a network in the related art, or may be simply ad hoc communication between at least two devices.

The Wi-Fi enables a connection to the Internet and the like even without a wire. The Wi-Fi is a wireless technology, such as a cellular phone, which enables the device, for example, the computer, to transmit and receive data indoors and outdoors, that is, in any place within a communication range of a base station. A Wi-Fi network uses a wireless technology, which is called IEEE 802.11 (a, b, g, etc.) for providing a safe, reliable, and high-rate wireless connection. The Wi-Fi may be used for connecting the computer to the computer, the Internet, and the wired network (IEEE 802.3 or Ethernet is used). The Wi-Fi network may be operated at, for example, a data rate of 11 Mbps (802.11a) or 54 Mbps (802.11b) in an unauthorized 2.4 and 5 GHz wireless band, or may be operated in a product including both bands (dual bands).

Those skilled in the art may appreciate that information and signals may be expressed by using predetermined various different technologies and techniques. For example, data, indications, commands, information, signals, bits, symbols, and chips referable in the foregoing description may be expressed with voltages, currents, electromagnetic waves, magnetic fields or particles, optical fields or particles, or a predetermined combination thereof.

Those skilled in the art will appreciate that the various illustrative logical blocks, modules, processors, means, circuits, and algorithm operations described in relationship to the embodiments disclosed herein may be implemented by electronic hardware (for convenience, called "software" herein), various forms of program or design code, or a combination thereof. In order to clearly describe compatibility of the hardware and the software, various illustrative components, blocks, modules, circuits, and operations are generally illustrated above in relation to the functions of the hardware and the software. Whether the function is implemented as hardware or software depends on design limits given to a specific application or an entire system. Those skilled in the art may perform the function described by various schemes for each specific application, but it shall not be construed that the determinations of the performance depart from the scope of the present disclosure.

Various embodiments presented herein may be implemented by a method, a device, or a manufactured article using a standard programming and/or engineering technology. A term "manufactured article" includes a computer program, a carrier, or a medium accessible from a predetermined computer-readable storage device. For example, the computer-readable storage medium includes a magnetic storage device (for example, a hard disk, a floppy disk, and a magnetic strip), an optical disk (for example, a CD and a DVD), a smart card, and a flash memory device (for example, an EEPROM, a card, a stick, and a key drive), but is not limited thereto. Further, various storage media presented herein include one or more devices and/or other machine-readable media for storing information.

It shall be understood that a specific order or a hierarchical structure of the operations included in the presented processes is an example of illustrative accesses. It shall be understood that a specific order or a hierarchical structure of the operations included in the processes may be rearranged within the scope of the present disclosure based on design priorities. The accompanying method claims provide various operations of elements in a sample order, but it does not mean that the claims are limited to the presented specific order or hierarchical structure.

The description of the presented embodiments is provided so as for those skilled in the art to use or carry out the present disclosure. Various modifications of the embodiments may be apparent to those skilled in the art, and general principles defined herein may be applied to other embodiments without departing from the scope of the present disclosure. Accordingly, the present disclosure is not limited to the embodiments suggested herein, and shall be interpreted within the broadest meaning range consistent to the principles and new characteristics presented herein.

What is claimed is:

1. A method for performing double clustering to place a semiconductor device, the method performed by a computing device, the method comprising:
   receiving a netlist representing a connection relationship between semiconductor devices;
   performing clustering on the semiconductor devices by partitioning connection relationship information expressed by a hypergraph into n regions after expressing the netlist by the hypergraph and utilizing group information obtained by processing each partition as one group;
   acquiring hierarchy information on the netlist for each of semiconductor devices included in a cluster generated by the clustering;
   identifying semiconductor devices classified into the same group in the hierarchy information on the netlist, among the semiconductor devices included in the cluster; and
   performing sub-clustering in the cluster by generating a sub-cluster including the identified semiconductor devices.

2. The method of claim 1, further comprising:
   evaluating a placement of the semiconductor device based on the sub-cluster generated based on the double clustering including the clustering and the sub-clustering.

3. The method of claim 2, wherein a type of the semiconductor device includes a macro device type and a standard device type and the macro device type and the standard device type are classified based on a device size.

4. The method of claim 3, wherein the double clustering including the clustering and the sub-clustering is performed on semiconductor devices corresponding to the standard device type.

5. The method of claim 4, wherein the evaluating of the placement of the semiconductor device includes:
   acquiring a sub-cluster to be placed; and
   calculating a reward related to a placement of the sub-cluster to be placed, based on a relationship between the sub-cluster to be placed, sub-clusters which have been already placed, and macro devices which have been already placed.

6. The method of claim 5, wherein the reward related to the placement of the sub-cluster to be placed includes at least one reward of a reward based on an optimization algorithm or a reward based on reinforcement learning.

7. The method of claim 6, wherein the reward related to the placement of the sub-cluster to be placed is calculated by assuming each of the sub-cluster to be placed and the sub-clusters which have been already placed as a single device.

8. The method of claim 1, further comprising:
   simulating a placement of the semiconductor device by utilizing electronic design automation (EDA) software; and partitioning the sub-cluster generated by the sub-clustering based on a result of the simulation utilizing the EDA software.

9. The method of claim 8, wherein the partitioning of the sub-cluster generated by the sub-clustering based on the result of the simulation utilizing the EDA software includes:
acquiring distance information between semiconductor devices included in the sub-cluster, based on the result of the simulation; and
generating two or more new sub-clusters by partitioning the semiconductor devices included in the sub-cluster based on the acquired distance information.

10. A computer program stored in a non-transitory computer readable storage medium, wherein the computer program is executed in one or more processors to allow the one or more processors to perform double clustering to place a semiconductor device by performing the following operations comprising:
an operation of receiving a netlist representing a connection relationship between semiconductor devices;
an operation of performing clustering on the semiconductor devices by partitioning connection relationship information expressed by a hypergraph into n regions after expressing the netlist by the hypergraph and utilizing group information obtained by processing each partition as one group;
an operation of acquiring hierarchy information on the netlist for each of semiconductor devices included in a cluster generated by the clustering;
an operation of identifying semiconductor devices classified into the same group in the hierarchy information on the netlist, among the semiconductor devices included in the cluster; and
an operation of performing sub-clustering in the cluster by generating a sub-cluster including the identified semiconductor devices.

11. The computer program of claim 10, wherein the operations further include:
an operation of evaluating a placement of the semiconductor device based on the sub-cluster generated based on the double clustering including the clustering and the sub-clustering.

12. The computer program of claim 11, wherein a type of the semiconductor device includes a macro device type and a standard device type and the macro device type and the standard device type are classified based on a device size.

13. The computer program of claim 12, wherein the double clustering including the clustering and the sub-clustering is performed on semiconductor devices corresponding to the standard device type.

14. The computer program of claim 13, wherein the operation of evaluating the placement of the semiconductor device includes:

an operation of acquiring a sub-cluster to be placed; and
an operation of calculating a reward related to a placement of the sub-cluster to be placed, based on a relationship between the sub-cluster to be placed, sub-clusters which have been already placed, and macro devices which have been already placed.

15. The computer program of claim 14, wherein the reward related to the placement of the sub-cluster to be placed includes at least one reward of a reward based on an optimization algorithm or a reward based on reinforcement learning.

16. The computer program of claim 15, wherein the reward related to the placement of the sub-cluster to be placed is calculated by assuming each of the sub-cluster to be placed and the sub-clusters which have been already placed as a single device.

17. A computing device, comprising:
at least one processor; and
a memory,
wherein the at least one processor is configured to:
receive a netlist representing a connection relationship between semiconductor devices,
perform clustering on the semiconductor devices by partitioning connection relationship information expressed by a hypergraph into n regions after expressing the netlist by the hypergraph and utilizing group information obtained by processing each partition as one group,
acquire hierarchy information on the netlist for each of semiconductor devices included in a cluster generated by the clustering,
identify semiconductor devices classified into the same group in the hierarchy information on the netlist, among the semiconductor devices included in the cluster, and
perform sub-clustering in the cluster by generating a sub-cluster including the identified semiconductor devices.

18. The computing device of claim 17 wherein the at least one processor is further configured to:
simulate placement of a semiconductor device by utilizing electronic design automation (EDA) software and partition the sub-cluster generated by the sub-clustering based on a result of the simulation utilizing the EDA software.

19. The computing device of claim 18, wherein the at least one processor is further configured to:
acquire distance information between semiconductor devices included in the sub-cluster, based on the result of the simulation, and
generate two or more new sub-clusters by partitioning the semiconductor devices included in the sub-cluster based on the acquired distance information.

* * * * *